(12) United States Patent
Takeshian et al.

(10) Patent No.: US 10,879,919 B1
(45) Date of Patent: Dec. 29, 2020

(54) VOLTAGE STABILIZING TECHNIQUES

(71) Applicant: Arm Limited, Cambridge (GB)

(72) Inventors: Tirdad Anthony Takeshian, Vence (FR); Vincent Gouin, Mandelieu (FR); Robert Christiaan Schouten, Grasse (FR); Shidhartha Das, Upper Cambourne (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/523,770

(22) Filed: Jul. 26, 2019

(51) Int. Cl.
  *H03M 1/00* (2006.01)
  *H03M 1/44* (2006.01)
  *H03M 1/16* (2006.01)

(52) U.S. Cl.
  CPC ............ *H03M 1/001* (2013.01); *H03M 1/164* (2013.01); *H03M 1/442* (2013.01)

(58) Field of Classification Search
  CPC ....... H03M 1/001; H03M 1/164; H03M 1/442
  USPC .......................................................... 341/155
  See application file for complete search history.

(56) References Cited

U.S. PATENT DOCUMENTS

| | | | | |
|---|---|---|---|---|
| 6,167,132 A * | 12/2000 | Krone | ................. | H04L 25/0266 341/143 |
| 6,396,334 B1 * | 5/2002 | Aram | .................... | H02M 3/073 327/541 |
| 8,884,629 B1 * | 11/2014 | Kumar | ................. | H03F 1/0277 324/523 |
| 10,447,164 B2 * | 10/2019 | Ida | ...................... | H03K 17/0822 |
| 10,468,089 B1 * | 11/2019 | Chen | ................... | G11C 11/4091 |
| 10,613,568 B1 * | 4/2020 | Hu | ...................... | H03K 17/0812 |

OTHER PUBLICATIONS

Mair, et al.; A 10nm FinFET 2.8GHz Tri-Gear Deca-Core CPU Complex with Optimized Power-Delivery Network for Mobile SoC Performance; 2017 ISSCC; Mar. 2017. DOI: 10.1109/ISSCC.2017.7870258.

* cited by examiner

*Primary Examiner* — Brian K Young
(74) *Attorney, Agent, or Firm* — Pramudji Law Group PLLC; Ari Pramudji (57) ABSTRACT

Various implementations described herein are directed to device having multiple stages. The device may include a first stage that converts an analog voltage signal in a power supply domain into a digitally coded signal. The device may include a second stage that generates a derivative of the digitally coded signal, detects an event of the analog voltage signal based on the derivative of the digitally coded signal, and derives a control signal based on the event. The device may include a third stage that injects current into or sinks current from the power supply domain that is associated with the analog voltage signal based on the control signal.

16 Claims, 4 Drawing Sheets

VOLTAGE STABILIZING TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional designs, increased integration comes at the cost of increasing peak current, faster clocks and lower supply voltages. The increase in peak current and faster clocks give rise to AC power supply noise that poses a threat to CPU performance and robustness. As such, there exists a need to mitigate against induced AC supply noise as a result of higher peak currents and faster clocks.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to integrated circuitry (IC) for providing voltage stabilizing schemes and techniques in various low power supply domain applications. For instance, various schemes and techniques described herein provide for a system that is configured to stabilize supply voltage (Vdd_core) in a power domain based on a voltage monitor that senses the supply voltage (Vdd_core), a controller that receives digital information from the voltage monitor or sensor, and also, controlling a quantity of current injected into the power domain to be stabilized, based on variation over time in the supply voltage (Vdd_core) domain. In some instances, the various schemes and techniques described herein are configured to use a derivative or an average value of the voltage measured by the voltage monitor or sensor to determine an amount of corrective current to inject into or sink current from the supply voltage (Vdd_core) domain. Also, in some instances, the various schemes and techniques described herein may use an internal current source to supply corrective current, which is provided by internal circuitry that is partially or fully isolated from current transients during operation of other external power supplies.

In some implementations, various schemes and techniques described herein mitigate against di/dt induced AC power supply noise as a result of higher peak currents and faster clocks. Some power distribution networks (PDNs) for systems on chips (SOCs) to the first order may be modelled as a distributed LC (inductance capacitance) network, and in such networks, there may be resonant frequencies that once excited by di/dt events may lead to large sinusoidal oscillations. These power domain pathogens may degrade timing margins and lead to CPU malfunction. As such, various schemes and techniques described herein provide for mitigating against AC signal noise that is generated on the Vdd_core domain by preventing or at least inhibiting LC current from changing by providing an alternative source of current for the CPU during di/dt events.

Various implementations of voltage stabilizing schemes and techniques will be described in detail herein with reference to FIGS. 1-3.

Figure 1:
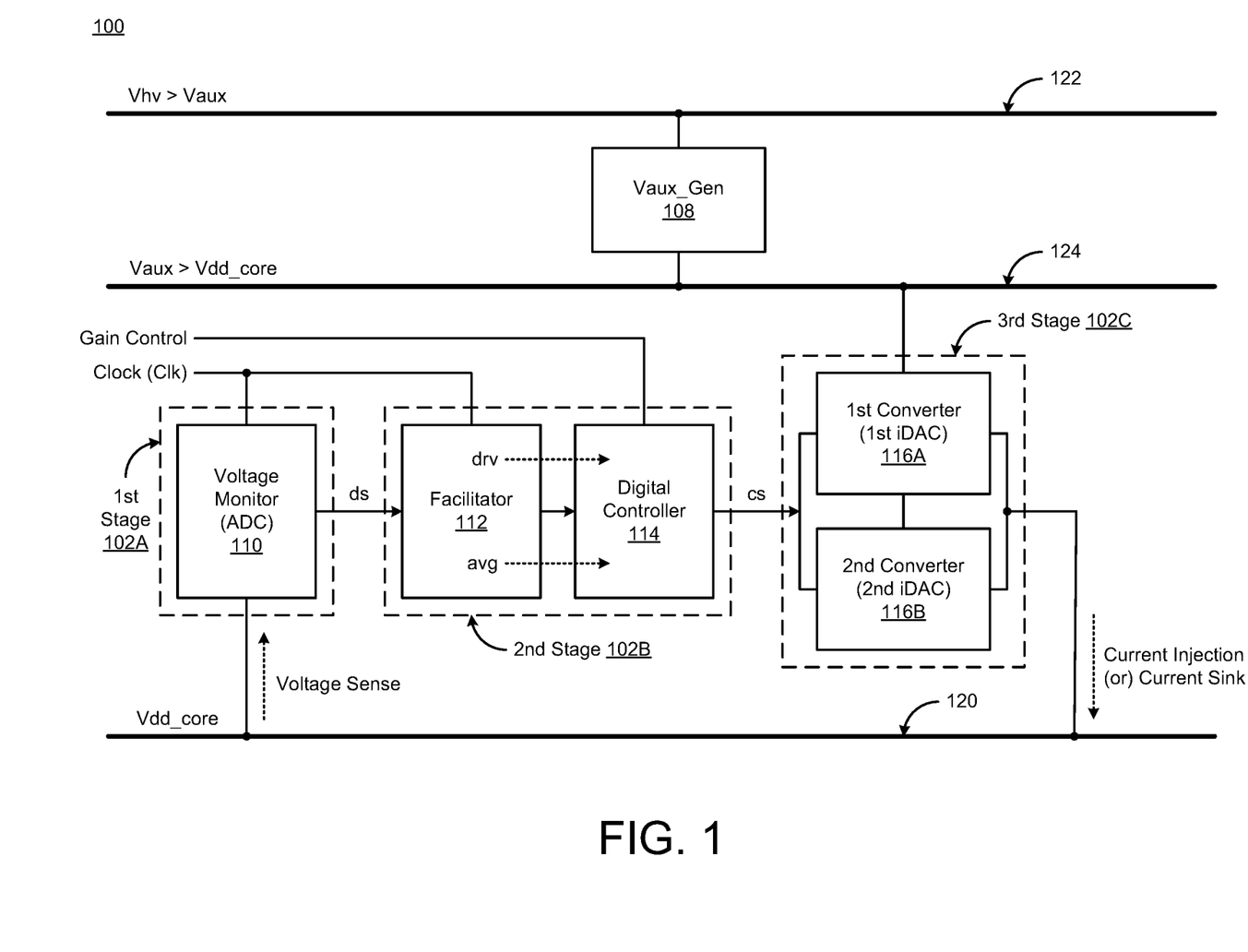
FIG. 1 illustrates a diagram of voltage stabilizing circuitry in accordance with various implementations described herein.

FIG. 1 illustrates a diagram of voltage stabilizing circuitry 100 in accordance with various implementations described herein. In some instances, the voltage stabilizing circuitry 100 may be implemented as an integrated circuit (IC) in a system or device having various circuit components that are arranged and coupled together as an assemblage or combination of parts that provide for a physical circuit design and related structures. Also, in some instances, a method of designing, providing and building the voltage stabilizing circuitry 100 may involve use of the various circuit components described herein so as to thereby implement voltage stabilizing schemes and techniques associated therewith. In various instances, the voltage stabilizing circuitry 100 may be implemented as integrated circuitry (IC) with various types of embedded systems for various electronic, mobile and Internet-of-things (loT) applications, including low power sensor nodes.

As shown in FIG. 1, the voltage stabilizing circuitry 100 may include multiple power supply domains, including, e.g., a high voltage domain (Vhv) and a core voltage domain (Vdd_core). The high voltage domain (Vhv) may be greater than an auxiliary voltage (Vaux) such that Vhv>Vaux, and the auxiliary voltage (Vaux) may be greater than the core voltage domain (Vdd_core) such that Vaux>Vdd_core. The core voltage domain (Vdd_core) may fluctuate such that various types of events, such as, e.g., peak events, zero-crossing events, and trough events, occur in reference to the nominal voltage level of the core voltage domain (Vdd_core).

In some implementations, as shown, an auxiliary voltage generator (Vaux_Gen) 108 may be coupled between the high voltage domain (Vhv) and the auxiliary voltage (Vaux). The core voltage domain (Vdd_core) may be provided on a core supply voltage line 120, the high voltage domain (Vhv) may be provided on a Vhv supply line 122, and the auxiliary voltage (Vaux) may be provided on a Vaux supply line 124. Vaux may be generated internally. In some instances, the voltage stabilizing circuitry 100 may be coupled between the auxiliary voltage (Vaux) and the core voltage domain (Vdd_core).

The voltage stabilizing circuitry 100 may include a first stage 102A that receives a voltage signal (e.g., sensing a voltage sense signal) and converts the sensed voltage signal (e.g., voltage sense) in a power supply domain (e.g., Vdd_core) into a digital signal, which may refer to a digitally coded signal (ds). Also, the first stage 102A may include a monitor 110, which may be referred to as a voltage monitor, and the voltage signal (e.g., voltage sense) may refer to an analog voltage signal. The first stage 102A may include an analog-to-digital converter (ADC) that senses the analog voltage signal (e.g., voltage sense) in the power supply domain (e.g., Vdd_core), converts the analog voltage signal (e.g., voltage sense) into the digitally coded signal (ds), and provides the digitally coded signal (ds) to the second stage 102B. Thus, in some instances, the sensed voltage signal (e.g., voltage sense) refers to an analog voltage signal in the power supply domain (e.g., Vdd_core) that is provided on a supply voltage line 120, and the digital signal (ds) refers to a digital representation of the analog voltage signal in the power supply domain (e.g., Vdd_core), wherein the digital representation refers to a digitally coded signal.

The voltage stabilizing circuitry 100 may include a second stage 102B that generates a derivative (drv) or an average value (avg) of the digitally coded signal (ds), detects an event of the analog voltage signal (e.g., voltage sense) based on the derivative (drv) or the average value (avg) of the digitally coded signal (ds), and derives a control signal (cs) based on the event. The second stage 102B may include a facilitator 112 and a controller 114, wherein the facilitator 112 may include a derivative generator and/or an average value generator, and the controller 114 may include a digital controller. In some instances, the derivative generator may receive the digitally coded signal (ds) from the ADC and generate the derivative (drv) of the digitally coded signal (ds). The average value generator may receive the digitally coded signal (ds) from the ADC and generate the average value (avg) of the digitally coded signal (ds). Also, the digital controller may receive the derivative (drv) of the digitally coded signal (ds) from the derivative generator, detect the event of the analog voltage signal (e.g., voltage sense) based on the derivative (drv), and derive the control signal (cs) based on the event. In some cases, the facilitator 112 may receive the digitally coded signal from the ADC and generate the average value (avg) of the digital signal by adding different samples of the voltage signal (e.g., voltage sense) and dividing the different samples by a number (N) of samples.

In some instances, the second stage 102B may determine a modulus value (or, e.g., absolute value) of the derivative (drv) of the digitally coded signal (ds) so as to detect the event of the analog voltage signal (e.g., voltage sense). Also, in some instances, the event may refer to a significant event or substantial event, such as, e.g., at least one of a zero-crossing event, a peak event and a trough event of the analog voltage signal (e.g., voltage sense). Thus, the analog voltage signal (e.g., voltage sense) may be provided on the supply voltage line 120 in the power supply domain (e.g., Vdd_core), the event may refer to a significant change in a slope or a modulus level of the digitally coded signal (ds), and the significant change in the slope of the digitally coded signal (ds) may refer to a sizable magnitude event in reference to a substantial change in current amplitude.

In some instances, a clock signal (Clk) may be provided to the voltage monitor (ADC) 110 of the first stage 102A and the facilitator 112 of the second stage 102B. Also, in some instances, a gain control signal may be provided to the digital controller 114 of the second stage 102B.

The voltage stabilizing circuitry 100 may include a third stage 102C that injects current (e.g., current injection) into or sinks current (current sink) from the power supply domain (e.g., Vdd_core) that is associated with the analog voltage signal (e.g., voltage sense) based on the control signal (cs). The third stage 102C may include a first converter 116A and a second converter 116B. In some instances, the converters 116A, 116B may include current based digital-to-analog converters (iDACs), including, e.g., a first iDAC 116A and a second iDAC 116B. Also, in some instances, the first iDAC 116A may refer to a p-type iDAC (i.e., ipDAC) as shown in FIG. 2A, and the second iDAC 116B may refer to an n-type iDAC (i.e., inDAC) as shown in FIG. 2B.

As such, in some instances, the third stage 102C may include the first iDAC 116A (e.g., ipDAC) that may receive the control signal (cs) from the digital controller 114 and inject current onto a supply voltage line 120 in the power supply domain (Vdd_core), which is associated with the analog voltage signal (e.g., voltage sense). Also, in various instances, the third stage 102C may include the second iDAC 116B (e.g., inDAC) that may receive the control signal (cs) from the digital controller 114 and sink current from the supply voltage line 120 in the power supply domain (Vdd_core), which is associated with the analog voltage signal (e.g., voltage sense). As such, in this instance, the third stage 102C may sink current from the power supply domain (e.g., Vdd_core) so as to suppress overshoot of the analog voltage signal (e.g., voltage sense). Also, the second stage 102B and/or the third stage 102C may be configured to isolate the power supply domain (e.g., Vdd_core) from higher voltage supplies (e.g., Vhv).

In some implementations, in reference to FIG. 1, the monitor 110 refers to an ADC that senses the voltage signal (e.g., voltage sense) and provides the digital signal (ds) of the voltage signal (e.g., voltage sense) by sampling the voltage signal (e.g., voltage sense) in the power supply domain (Vdd_core). Also, the facilitator 112 may receive the digital signal (ds) from the ADC and generate the average value (avg) of the digital signal (ds). In some instances, the average may be calculated by keeping track of a running sum of previous N samples and dividing by N. The facilitator 112 includes a derivative generator that receives the digital signal (ds) from the ADC, detects a derivative (drv) of the digital signal (ds) by determining a slope of the digital signal (ds), and generates the derivative (drv) of the digital signal (ds) based on the slope of the digital signal (ds). In some instances, the significant event may refer to a sizable change in the slope of the digital signal (ds), and the sizable change in the slope of the digital signal (ds) refers to a substantial change (or significant change) in amplitude of the voltage signal (e.g., voltage sense). Also, the controller 114 may refer to a digital controller that receives the derivative (drv) of the digital signal (ds) from the derivative generator of the facilitator 112, compares the derivative (drv) of the digital signal (ds) to a threshold value so as to select the significant event from the slope of the digital signal (ds). The significant event may refer to significant magnitude event or a substantial amplitude event. Also, the converter(s) 116A, 116B may refer to current-based digital-to-analog converter (iDACs), and the iDACs may inject current onto or sink current from the supply voltage line 120 in the power supply domain (Vdd_core) with an analog current that is proportional to the slope of the digital signal (ds).

In some implementations, the voltage stabilizing circuitry 100 may be referred to as a dynamic hyper-boost voltage stabilizer that is configured to use the Vdd_core derivative to detect di/dt events, wherein a current that is proportional to the slope of the derivative may be injected into the Vdd_core power domain. In some instances, di/dt events may be in a ~300 psec time scale range, while resulting AC noise may be in a 10 nsec time scale range, and as such, this time difference may allow for use and employment of various mitigation schemes and techniques as described herein.

In some implementations, various schemes and techniques described herein monitor the first derivative (Vdd_dry or d_vdd/dt) of the power domain voltage, and/or in some cases, use the modulus or absolute value of the detected event to inject or sink current. The derivative may be monitored by taking the difference between two consecutive measured samples of Vdd_core to determine the slope of the voltage noise observed on the power domain. In some instances, monitoring Vdd_dry instead of Vdd_core has major advantages. For instance, one advantage refers to monitoring Vdd_dry (i.e., where Vdd_dry refers to the slope of Vdd_core) that occurs ~¼ cycle ahead of the DC voltage crossing, which translates to a reduction in the reaction time. In some instances, a positive sign may be used to activate inDAC (116B), and a negative sign may be used to activate ipDAC (116A). In some instances, the supply domain is typically capacitive which means that the voltage lags the current, and since the voltage is sensed, there may be a delay in reaction time. The derivative of the voltage is in sync with the current hence effectively we improve our reaction time). In some instances, another advantage refers to obtaining a better result, wherein a maximum current may be injected at the DC voltage crossing and procced to taper off. In this instance, Vdd_dry may have the desired profile where as Vdd_core detection tends to build-up gradually. It should be noted that more gain may be needed for this Vdd_dry monitoring approach when compared to a DC Vdd_abs (Vdd_core absolute) type of monitoring approach as signal levels may be smaller.

In some implementations, a negative slope greater than a pre-programed value (or threshold) may be considered as an undershoot and may activate a current injection by the current source to limit voltage droop on the power domain. Otherwise, if the slope is positive and greater than the pre-programed value (or threshold), it may be considered as an overshoot and may activate a current sink to limit the voltage overshoot. To avoid using an additional supply voltage (e.g., where Vhv>Vdd_core) to bias the iDAC during droop mitigation, the Vio (or Vhv) supply may be used to charge the switched capacitor (e.g., use of P1 and C1 as a switched capacitor). In some instances, Vio refers to the IO ring supply for coupling electro-static discharge (ESD) protection circuitry to the circuitry. In some instances, during a di/dt event, the capacitor (C1) may be disconnected (or decoupled) from Vio (or Vhv) and allowed to discharge into the Vdd_core power domain in a controlled fashion using the iDAC. Also, the iDAC may provide for isolation between the Vio (or Vhv) and Vdd_core power domains.

Alternatively, a capacitor charge pump may be used to boost Vhv to values that are greater than Vio for even higher current drive capability. In some instances, this may be similar or equivalent to using a larger decoupling capacitor.

$$C_{eff} = C_{decap} \times \frac{Vhv}{Vdd}$$

In some implementations, various schemes and techniques described herein may provide for dynamic isolation of Vhv. For instance, the isolation module provided by the Vaux_Gen 108 or the switch capacitor (P1 and C1) is capable of isolating Vhv from higher currents and fast current transients. In reference to control of the iDAC, the switch between Vhv and Vaux is dynamically controlled to define the current profile desired on Vhv. This isolation may be fully configurable, from total isolation during current events to partial isolation, so as to provide adaption to some applications of Vhv.

Figure 2A:
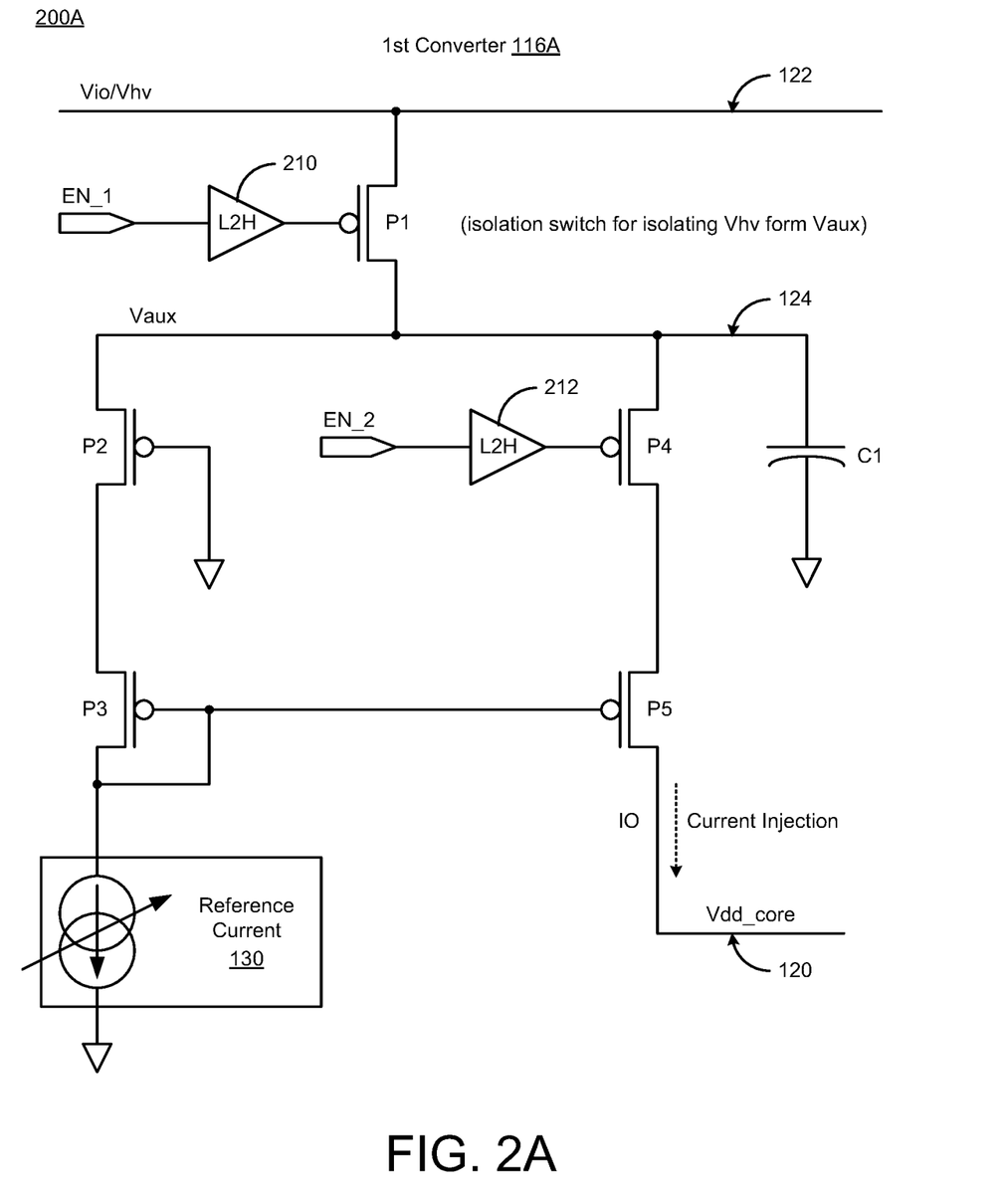
FIGS. 2A-2B illustrate various diagrams of converter circuitry in accordance with various implementations described herein.
Figure 2B:
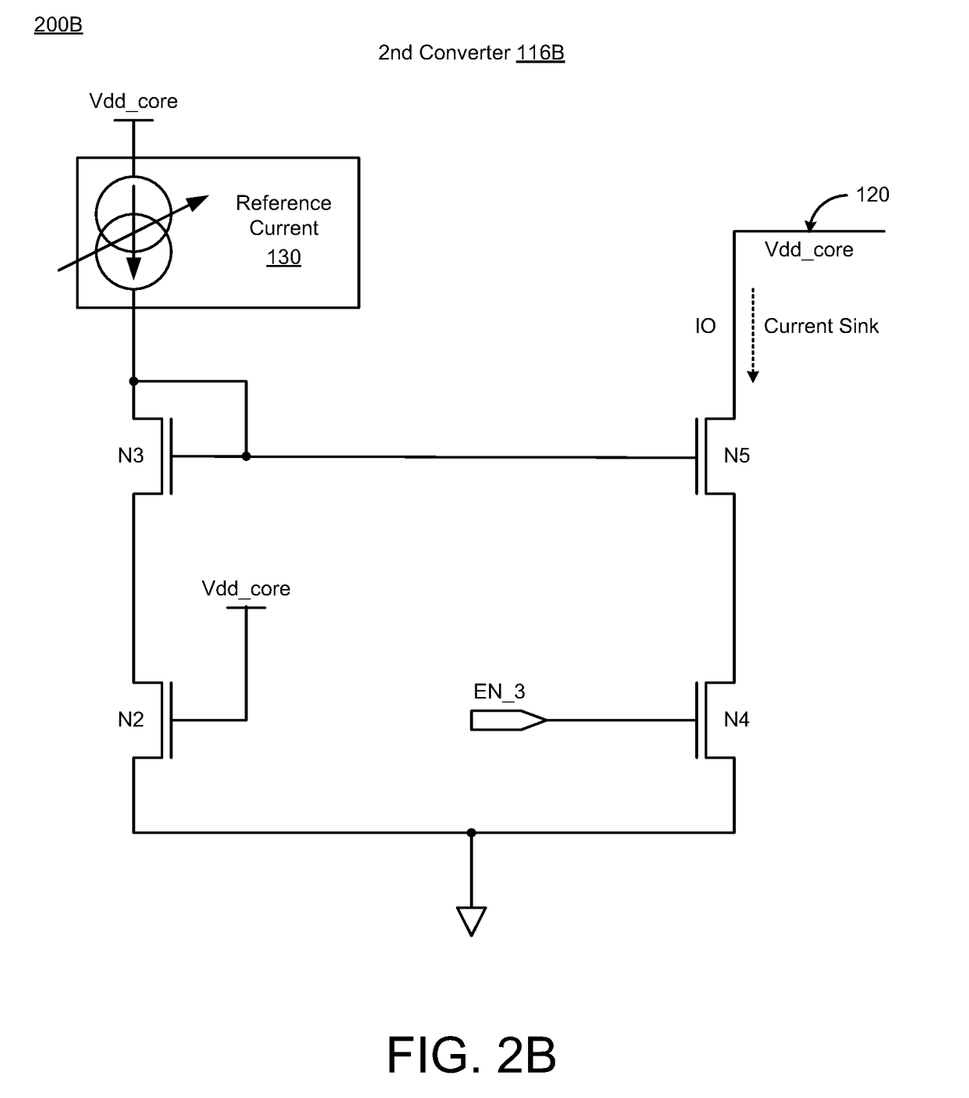

FIGS. 2A-2B illustrate various diagrams of converter circuitry 200A, 200B in accordance with various implementations described herein. In particular, FIG. 2A refers to a diagram of p-type converter circuitry 200A, and FIG. 2B refers to another diagram of n-type converter circuitry 200B.

As shown in FIG. 2A, the converter circuitry may be implemented as a p-type digital-to-analog converter (ip-DAC) 116A having multiple transistors (P1, P2, P3, P4, P5) arranged and coupled together to inject current on or into the core voltage supply line 120 in the core voltage domain (Vdd_core). For instance, the transistor (P1) may be coupled between the high voltage supply line 122 (Vhv or Vio) and the auxiliary voltage supply line (Vaux) 124. Also, a first enable signal (EN_1) may be coupled to a gate of transistor (P1) via a low-to-high (L2H) voltage amplifier 210, and the first enable signal (EN_1) may deactivate (e.g., during isolation, P1 may be turned off/deactivated) the transistor (P1) for operation as an isolation switch for isolating the high voltage domain (Vhv) from the Vdd_core voltage domain. Vio (or Vhv) is isolated from Vdd_core. Vaux is an intermediate net connected to a top plate of the capacitor (C1). When P1 is activated, the top plate (Vaux) of C1 is charged up to Vhv. When P1 is deactivated, the top plate of C1 (Vaux) can discharge to Vdd_core.

The converter circuitry 200A may include transistors (P2, P3) coupled between the auxiliary voltage line (Vaux) 124 and ground (Vss or Gnd). As shown, transistor (P2) may be coupled between the Vaux line 124 and transistor (P3), and transistor (P3) may be coupled between transistor (P2) and a reference current (Iref) 130 source, and the Iref source 130 may be coupled between transistor (P3) and ground (Vss or Gnd). In some instances, a gate of transistor (P2) may be coupled to ground (Vss or Gnd), and a gate of transistor (P3) may be coupled to an output of itself.

The converter circuitry 200A may include transistors (P4, P5) coupled between the auxiliary voltage line (Vaux) 124 and the core voltage supply line (Vdd_core) 120. As shown, transistor (P4) may be coupled between the Vaux line 124 and transistor (P5), and transistor (P5) may be coupled between transistor (P4) and the core voltage supply line (Vdd_core) 120. In some instances, P4 may be a 5-bit binary weighted transistor. Also, a second enable signal (EN_2) may be coupled to a gate of transistor (P4) via a low-to-high (L2H) voltage amplifier 212, and the second enable signal (EN_2) may activate the transistor (P4). In some instances, EN_2 is a 5-bit digital code, and this is the input to the ipDAC, and the output drain of P5 is a scaled current proportional to the digital code. In some instances, transistors P3 and P5 are coupled as a current mirror, and as such, transistor P5 operates as a current source rather than a pass transistor. Thus, when activated, transistors (P4, P5) may be used to inject current into or on to the core voltage supply line 120 from the Vaux line 124. Also, as shown, a capacitor (C1) may be coupled between the Vaux line 124 and ground (Vss or Gnd). In some instances, the transistor (P1) and the capacitor (C1) may operate as a switched capacitor.

As shown in FIG. 2B, the converter circuitry 200B may be implemented as an n-type digital-to-analog converter (inDAC) 116B having multiple transistors (N2, N3, N4, N5) arranged and coupled together to sink current from the core voltage supply line 120 in the core voltage domain (Vdd_core). For instance, the converter circuitry 200B may include transistors (N2, N3) coupled between the supply voltage line (Vdd_core) and ground (Vss or Gnd). As shown, transistor (N2) may be coupled between transistor (N3) and ground (Vss or Gnd), and transistor (N3) may be coupled between the reference current (Iref) 130 source and transistor (N2), and the Iref source 130 may be coupled between the supply voltage line (Vdd_core) and transistor (N3). In some instances, a gate of transistor (N2) may be coupled to the supply voltage line (Vdd_core), and a gate of transistor (N3) may be coupled to an input of itself.

In some instances, the converter circuitry 200B may include transistors (N4, N5) coupled between the core voltage supply line (Vdd_core) 120 and ground (Vss or Gnd). As shown, transistor (N4) may be coupled between transistor (N5) and ground (Vss or Gnd), and also, transistor (N5) may be coupled between the core voltage supply line (Vdd_core) 120 and transistor (N4). Also, a third enable signal (EN_3) may be coupled to a gate of transistor (N4), and the third enable signal (EN_3) may activate the transistor (N4). In some instances, EN_3 is a 5-bit digital code, and this is the input to the inDAC, and the output drain of n5 is a scaled current proportional to the digital code. Thus, when activated, transistors (N4, N5) may be used to sink current from the core voltage supply line 120 to ground (Vss or Gnd).

Figure 3:
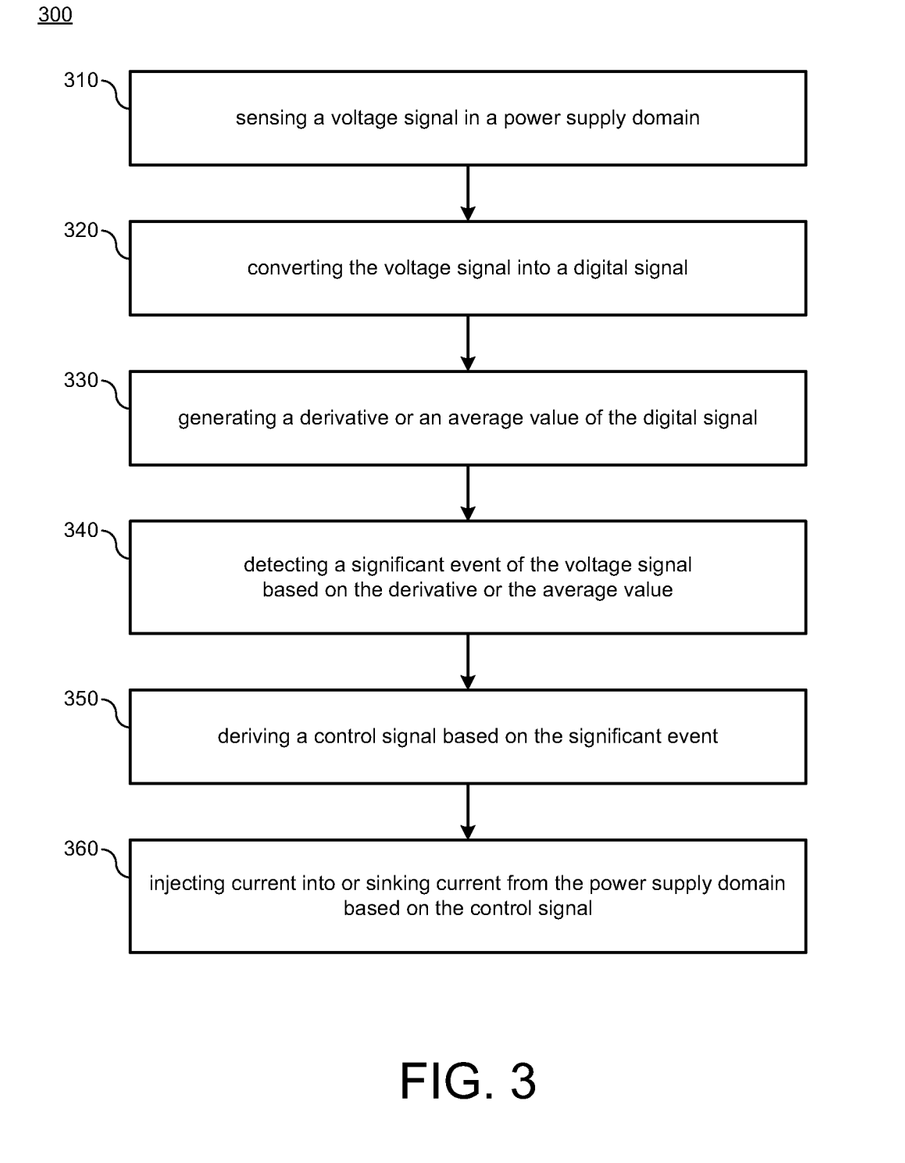
FIG. 3 illustrates a process flow diagram of a method for stabilizing voltage in a power supply domain in accordance with implementations described herein.

FIG. 3 illustrates a process diagram of a method 300 for stabilizing voltage in a power supply domain in accordance with implementations described herein.

It should be understood that even though method 300 may indicate a particular order of operation execution, in some cases, various certain portions of the operations may be executed in a different order, and on different systems. In other cases, additional operations and/or steps may be added to and/or omitted from method 300. Also, method 300 may be implemented in hardware and/or software. If implemented in hardware, the method 300 may be implemented with various circuit elements, such as described herein above in reference to FIGS. 1-2B. If implemented in software, the method 300 may be implemented as a program and/or software instruction process that may be configured for voltage stabilizing schemes and techniques as described herein. Also, if implemented in software, instructions related to implementing the method 300 may be stored in memory and/or a database. For instance, a computer or various other types of computing devices having a processor and memory may be configured to perform method 300.

As described and shown in reference to FIG. 3, method 300 may be used for designing, creating, routing, fabricating and/or manufacturing an integrated circuit (IC) that implements the voltage stabilizing schemes and techniques as described herein. Also, in reference to FIG. 3, method 300 may be configured to translate a physical design of an integrated circuit while preserving logical behaviors and characteristics.

At block 310, method 300 may sense a voltage signal in a power supply domain. The voltage signal may refer to an analog voltage signal in the power supply domain that is provided on a supply voltage line.

At block 320, method 300 may convert the voltage signal into a digital signal. The digital signal may refer to a digital representation of the voltage signal in the power supply domain, and the digital representation may refer to a digitally coded signal. Also, the digital signal may have an amplitude, and method 300 may determine the amplitude of the digital signal based on the derivative or the average value of the digital signal. In some instances, method 300 may be configured for sampling the voltage signal in the power supply domain and generating the derivative of the digital signal by determining a difference between consecutive samples of the voltage signal. In other instances, method 300 may generate the average value of the digitally signal by adding different samples of the voltage signal and dividing the different samples by a number of samples.

At block 330, method 300 may generate a derivative or an average value of the digital signal, and at block 340, method 300 may detect a significant event of the voltage signal based on the derivative or the average value. In some instances, method 300 may determine a slope of the digital signal, generate the derivative of the digital signal based on the slope of the digital signal, and compare the derivative of the digital signal to a threshold value so as to select the significant event from the slope of the digital signal. In other instances, the significant event refers to a sizable change in the slope of the digital signal, and the sizable change in the slope of the digital signal may refer to a substantial change in current amplitude.

At block 350, method 300 may derive a control signal based on the significant event, and at block 360, method 300 may inject current into or sink current from the power supply domain based on the control signal. In some instances, method 300 may inject current into or sink current from the power supply domain with an analog current that is proportional to the slope of the digital signal. Also, in other instances, method 300 may inject current into or sink current from the power supply domain by converting the control signal into an analog current and injecting the analog current onto or sinking current from a supply voltage line in the power supply domain.

The various schemes and techniques described herein provide for advantages over conventional designs. For instance, aspects of the disclosure provide for improved reaction time to di/dt pathogens and provide for using a first derivative of the Vdd_core variation to engage. Also, schemes and techniques described herein do not use additional power supplies for droop/undershoot mitigation. In some instances, aspects of the disclosure allow use of existing Vio due to isolation circuitry that provides improved isolation between the core supply and the auxiliary source through use of a switched capacitor architecture and current source. Also, schemes and techniques described herein are compatible with DVFS (Dynamic Voltage Frequency Scaling) operation. In addition, no fixed reference is needed, and the stabilization schemes and techniques follow a long term scaled voltage, as it uses the derivative of Vdd_core to inject corrective current. Further, aspects of the disclosure provide for restoration of timing margins and operational robustness, and also, aspects of the disclosure provide for improvement in power, performance and area (PPA) by allowing or at least providing for operation at lower Vmin and higher clock frequencies.

Described herein are various implementations of a device. The device may include a first stage that converts an analog voltage signal in a power supply domain into a digitally coded signal. The device may include a second stage that generates a derivative of the digitally coded signal, detects an event of the analog voltage signal based on the derivative of the digitally coded signal, and derives a control signal based on the event. The device may include a third stage that injects current into or sinks current from the power supply domain that is associated with the analog voltage signal based on the control signal.

Described herein are various implementations of a system. The system may include a monitor that senses a voltage signal in a power supply domain and provides a digital signal of the voltage signal. The system may include a facilitator that receives the digital signal from the voltage monitor and generates an average value of the digital signal. The system may include a controller that receives the average value of the digital signal from the facilitator, detects a significant event of the voltage signal based on the average value of the digital signal, and derives a control signal based on the significant event. The system may include a converter that receives the control signal from the controller and injects current onto or sinks current from a supply voltage line in the power supply domain based on the control signal.

Described herein are various implementations of a method. The method may include sensing a voltage signal in a power supply domain. The method may include converting the voltage signal into a digital signal. The method may include generating a derivative or an average value of the digital signal. The method may include detecting a significant event of the voltage signal based on the derivative or the average value. The method may include deriving a control signal based on the significant event. The method may include injecting current into or sinking current from the power supply domain based on the control signal.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
   a first stage that converts an analog voltage signal in a power supply domain into a digitally coded signal;
   a second stage that generates a derivative of the digitally coded signal, detects an event of the analog voltage signal based on the derivative of the digitally coded signal, and derives a control signal based on the event; and
   a third stage that injects current into or sinks current from the power supply domain that is associated with the analog voltage signal based on the control signal;
   wherein the first stage comprises an analog-to-digital converter (ADC) that senses the analog voltage signal in the power supply domain, converts the analog voltage signal into the digitally coded signal, and provides the digitally coded signal to the second stage.

2. The device of claim 1, wherein the second stage comprises a derivative generator that receives the digitally coded signal from the ADC and generates the derivative of the digitally coded signal.

3. The device of claim 2, wherein the second stage comprises a digital controller that receives the derivative of the digitally coded signal from the derivative generator, detects the event of the analog voltage signal based on the derivative, and derives the control signal based on the event.

4. The device of claim 3, wherein the third stage comprises a current-based digital-to-analog converter (iDAC) that receives the control signal from the digital controller and injects current onto or sinks current from a supply voltage line in the power supply domain that is associated with the analog voltage signal.

5. A device, comprising:
   a first stage that converts an analog voltage signal in a power supply domain into a digitally coded signal;
   a second stage that generates a derivative of the digitally coded signal, detects an event of the analog voltage signal based on the derivative of the digitally coded signal, and derives a control signal based on the event; and a third stage that injects current into or sinks current from the power supply domain that is associated with the analog voltage signal based on the control signal;
wherein:
the second stage determines a modulus value of the derivative of the digitally coded signal so as to detect the event of the analog voltage signal; or
the event refers to at least one of a zero-crossing event, a peak event and a trough event of the analog voltage signal; or
the third stage sinks current from the power supply domain to suppress overshoot of the analog voltage signal; or
the second stage or the third stage are configured to isolate the power supply domain from higher voltage supplies.

6. A device, comprising:
a first stage that converts an analog voltage signal in a power supply domain into a digitally coded signal;
a second stage that generates a derivative of the digitally coded signal, detects an event of the analog voltage signal based on the derivative of the digitally coded signal, and derives a control signal based on the event; and
a third stage that injects current into or sinks current from the power supply domain that is associated with the analog voltage signal based on the control signal;
wherein:
the analog voltage signal is provided on a supply voltage line in the power supply domain,
the event refers to a significant change in a slope or a modulus level of the digitally coded signal, and
the significant change in the slope of the digitally coded signal refers to a sizable magnitude event in reference to a substantial change in current amplitude.

7. A system, comprising:
a monitor that senses a voltage signal in a power supply domain and provides a digital signal of the voltage signal;
a facilitator that receives the digital signal from the voltage monitor and generates an average value of the digital signal;
a controller that receives the average value of the digital signal from the facilitator, detects a significant event of the voltage signal based on the average value of the digital signal, and derives a control signal based on the significant event; and
a converter that receives the control signal from the controller and injects current onto or sinks current from a supply voltage line in the power supply domain based on the control signal.

8. The system of claim 7, wherein the voltage signal is an analog voltage signal in the power supply domain that is provided on the supply voltage line, wherein the digital signal refers to a digital representation of the analog voltage signal in the power supply domain, and wherein the digital representation comprises a digitally coded signal.

9. The system of claim 7, wherein the monitor refers to an analog-to-digital converter (ADC), wherein the ADC senses the voltage signal and provides the digital signal of the voltage signal by sampling the voltage signal in the power supply domain, and wherein the facilitator receives the digital signal from the ADC and generates the average value of the digital signal by adding different samples of the voltage signal and dividing the different samples by a number of samples.

10. The system of claim 7, wherein the facilitator comprises a derivative generator that receives the digital signal from the monitor, detects a derivative of the digital signal by determining a slope of the digital signal, and generates the derivative of the digital signal based on the slope of the digital signal.

11. The system of claim 10, wherein the significant event refers to a sizable change in the slope of the digital signal, and wherein the sizable change in the slope of the digital signal refers to a substantial change in amplitude of the voltage signal.

12. The system of claim 10, wherein the controller comprises a digital controller, wherein the digital controller receives the derivative of the digital signal from the derivative generator, compares the derivative of the digital signal to a threshold value so as to select the significant event from the slope of the digital signal.

13. The system of claim 10, wherein the converter comprises a current-based digital-to-analog converter (iDAC), and wherein the iDAC injects current onto or sinks current from the supply voltage line in the power supply domain with an analog current that is proportional to the slope of the digital signal.

14. A method, comprising:
sensing a voltage signal in a power supply domain;
converting the voltage signal into a digital signal;
generating a derivative or an average value of the digital signal;
detecting a significant event of the voltage signal based on the derivative or the average value;
deriving a control signal based on the significant event; and
injecting current into or sinking current from the power supply domain based on the control signal;
wherein:
the voltage signal is an analog voltage signal in the power supply domain that is provided on a supply voltage line; or
the digital signal refers to a digital representation of the voltage signal in the power supply domain, and wherein the digital representation refers to a digitally coded signal; or
the digital signal has an amplitude, and wherein the method further comprises determining the amplitude of the digital signal based on the derivative or the average value of the digital signal; or
the significant event refers to a sizable change in the slope of the digital signal, wherein the sizable change in the slope of the digital signal refers to a substantial change in current amplitude, and wherein the method injects current into or sinks current from the power supply domain with an analog current that is proportional to the slope of the digital signal; or
the method injects current into or sinks current from the power supply domain by converting the control signal into an analog current and injecting the analog current onto or sinking current from a supply voltage line in the power supply domain.

15. A method, comprising:
sensing a voltage signal in a power supply domain;
converting the voltage signal into a digital signal;
generating a derivative or an average value of the digital signal;
detecting a significant event of the voltage signal based on the derivative or the average value;

deriving a control signal based on the significant event;
injecting current into or sinking current from the power supply domain based on the control signal;
determining a slope of the digital signal;
generating the derivative of the digital signal based on the slope of the digital signal; and
comparing the derivative of the digital signal to a threshold value so as to select the significant event from the slope of the digital signal.

16. A method, comprising:
sensing a voltage signal in a power supply domain;
converting the voltage signal into a digital signal;
generating a derivative or an average value of the digital signal;
detecting a significant event of the voltage signal based on the derivative or the average value;
deriving a control signal based on the significant event;
injecting current into or sinking current from the power supply domain based on the control signal;
sampling the voltage signal in the power supply domain; and
generating the derivative of the digital signal by determining a difference between consecutive samples of the voltage signal.

* * * * *